United States Patent
Weaver et al.

[11] Patent Number: 6,068,727
[45] Date of Patent: May 30, 2000

[54] APPARATUS AND METHOD FOR SEPARATING A STIFFENER MEMBER FROM A FLIP CHIP INTEGRATED CIRCUIT PACKAGE SUBSTRATE

[75] Inventors: Kevin C. Weaver, San Jose; Zhaomin Ji, Fremont, both of Calif.

[73] Assignee: LSI Logic Corporation, Milpitas, Calif.

[21] Appl. No.: 09/078,093

[22] Filed: May 13, 1998

[51] Int. Cl.⁷ .................................................. B32B 35/00
[52] U.S. Cl. .......................... 156/344; 156/584; 29/426.3; 29/426.5; 29/762
[58] Field of Search .................. 156/94, 344, 584; 29/402.03, 402.08, 426.1, 426.3, 426.5, 762; 228/191, 264

[56] References Cited

U.S. PATENT DOCUMENTS

| | | | |
|---|---|---|---|
| 4,274,576 | 6/1981 | Shariff | 228/264 |
| 4,832,250 | 5/1989 | Spigarelli et al. | 228/102 |
| 4,956,911 | 9/1990 | Zaremba et al. | 228/264 X |
| 5,367,762 | 11/1994 | Disko et al. | 29/764 |
| 5,375,319 | 12/1994 | Jacobs | 29/762 |
| 5,414,919 | 5/1995 | Soto | 29/426.5 X |
| 5,423,931 | 6/1995 | Inoue et al. | 156/344 X |
| 5,715,592 | 2/1998 | Mori et al. | 29/762 |
| 5,758,817 | 6/1998 | Chapman | 228/264 |
| 5,842,261 | 12/1998 | Oritz | 29/426.5 |

*Primary Examiner*—Mark A. Osele
*Attorney, Agent, or Firm*—Kevin L. Daffer; Conley, Rose & Tayon

[57] ABSTRACT

An apparatus and method are presented for separating a stiffener member from a substrate of a flip chip integrated circuit package such that the substrate is not damaged. The apparatus includes a base plate for receiving an upper portion of the device package including the stiffener, and a hand tool for receiving a lower portion of the device package including the substrate. During use, the base plate engages the upper portion of the device package and the hand tool engages the lower portion. The hand tool is moved in relation to the base plate such that an adhesive layer joining the stiffener and substrate is broken (i.e., sheared), and the stiffener is separated from the substrate. As the adhesive layer is typically an amorphous polymer material which softens with increased temperature, the base plate is preferably heated prior to effecting the movement of the hand tool in relation to the base plate. The base plate may be, for example, attached to an upper surface of a hot plate which is heated during operation of the hot plate.

13 Claims, 4 Drawing Sheets

APPARATUS AND METHOD FOR SEPARATING A STIFFENER MEMBER FROM A FLIP CHIP INTEGRATED CIRCUIT PACKAGE SUBSTRATE

BACKGROUND OF THE INVENTION

1. Field of Invention

This invention relates to integrated circuit packages, and more particularly to the disassembly of a flip chip integrated circuit package for subsequent evaluation.

2. Description of Related Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit (i.e., chip) is typically secured within a protective semiconductor device package. Each I/O pad of the integrated circuit is then connected to one or more terminals of the device package. The terminals of a device package are typically arranged about the periphery of the package. Fine metal wires are typically used to connect the I/O pads of the integrated circuit to the terminals of the device package. Some types of device packages have terminals called "pins" for insertion into holes in a printed circuit board (PCB). Other types of device packages have terminals called "leads" for attachment to flat metal contact regions on an exposed surface of a PCB. Newer ball grid array ("BGA") device packages described below have solder balls for attachment to flat metal pads on an exposed surface of a PCB.

As integrated circuit fabrication technology improves, manufacturers are able to integrate more and more functions onto single silicon substrates. As the number of functions on a single integrated circuit increases, the number of signal lines which need to be connected to external devices also increase. The corresponding number of required I/O pads and device package terminals increase as well, as do the complexities and costs of the device packages. Constraints of high-volume PCB assembly operations place lower limits on the physical dimensions of device packages and distances between device package terminals. As a result, the areas of peripheral-terminal device packages having hundreds of terminals are largely proportional to the number of terminals. In addition, the lengths of signal lines from integrated circuit I/O pads to device package terminals increase with the number of terminals, and the high-frequency electrical performance of larger peripheral-terminal device packages suffer as a result.

Controlled collapse chip connection (C4) is a well known method of attaching an integrated circuit directly to a substrate made of, for example, fiberglass-epoxy printed circuit board material or a ceramic material (e.g., aluminum oxide, alumina, $Al_2O_3$, or aluminum nitride, AlN). The C4 attachment method is commonly referred to as the "flip chip" method. In preparation for C4 attachment, the I/O pads of the integrated circuit are typically arranged in a two-dimensional array upon an underside surface of the integrated circuit, and a corresponding set of bonding pads are formed upon an upper surface of the substrate. A solder "bump" is formed upon each of the I/O pads of the integrated circuit. During C4 attachment of the integrated circuit to the substrate, the solder bumps are placed in physical contact with the bonding pads of the substrate. The solder bumps are then heated long enough for the solder to reflow. When the solder cools, the I/O pads of the integrated circuit are electrically and mechanically coupled to the bonding pads of the substrate. After the integrated circuit is attached to the substrate, the region between the integrated circuit and the substrate is filled with an "underfill" material which encapsulates the C4 connections and provides other mechanical advantages.

Grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from integrated circuit I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. FIG. 1 is a cross-sectional view of one embodiment of a BGA device package 10 in current use. BGA device 10 includes an integrated circuit 12 mounted upon an upper surface of a larger package substrate 14. Substrate 14 may be made of, for example, fiberglass-epoxy printed circuit board material or a ceramic material (e.g., aluminum oxide or aluminum nitride). Substrate 14 includes two sets of bonding pads: a first set adjacent to integrated circuit 12 and a second set arranged in a two-dimensional array across the underside surface of device package 10. The I/O pads of integrated circuit 12 are connected to corresponding members of the first set of bonding pads using the C4 technique described above. Members of the second set of bonding pads function as device package terminals, and have solder balls 15 attached to the bonding pads. Solder balls 15 allow device package 10 to be surface mounted to an ordinary PCB.

Substrate 14 includes one or more layers of electrically conductive "traces" (i.e., signal lines) which connect respective members of the first and second sets of bonding pads. In the embodiment of FIG. 1, a conductive trace 16 formed upon the upper surface of substrate 14 connects a member of the first set of bonding pads 18 to a corresponding member of the second set of bonding pads 20 by way of a vertical via 22. A layer of a solder mask material 24 forms a dielectric layer over conductive trace 16, and also seals and protects conductive trace 16 from moisture and reactive gases in the ambient.

Prior to C4 mounting of integrated circuit 12 upon substrate 14, a stiffener 26 is attached to the perimeter of the upper surface of substrate 14 by a first adhesive layer 28. Stiffener 26 helps substrate 14 maintain a substantially planar shape during and after C4 mounting of integrated circuit 12 upon substrate 14. The material used to form first adhesive layer 28 is typically a thermosetting polymer (e.g., an epoxy resin) which is dispensed in liquid form and becomes substantially rigid (i.e., hardens) during a curing process (e.g., with time and/or elevated temperature). First adhesive layer 28 may be, for example, a layer of an epoxy compound including particles of a thermally conductive material (e.g., silver, aluminum, boron nitride, etc.).

During the C4 mounting of integrated circuit 12 upon substrate 14, solder bumps 30 are heated long enough for the solder to reflow. When the solder cools, the I/O pads are electrically and mechanically coupled to corresponding members of the first set of bonding pads. A layer of underfill material 32 is then formed in the region between integrated circuit 12 and substrate 14.

Following the C4 mounting process, a heat spreader 34 is attached to the upper surface of stiffener 26. Heat spreader 34 conducts heat energy away from integrated circuit 12 during operation. During the attachment process, a thermal interface layer 36 is formed between heat spreader 34 and integrated circuit 12, and a second adhesive layer 38 is formed between heat spreader 34 and stiffener 26. Thermal interface layer 36 may be, for example, a layer of a an epoxy compound including particles of a thermally conductive material (e.g., silver, aluminum, boron nitride, etc.). Alternately, thermal interface layer 36 may be a layer of thermal grease, thermal wax, or a piece of thermal interface tape. Second adhesive layer 38 may be, for example, a layer of an epoxy compound including particles of a thermally conductive material (e.g., silver, aluminum, boron nitride, etc.).

Device packages must routinely be disassembled in order to evaluate the fabrication process and for failure analysis. To separate stiffener 26 and substrate 14, a thin wedge (e.g., a razor blade) is typically forced into first adhesive layer 28 between stiffener 26 and substrate 14. The wedge cuts through a portion of first adhesive layer 28. The wedge may also be used to pry stiffener 26 and substrate 14 apart, breaking an uncut portion of first adhesive layer 28. Prior to the separation process, first adhesive layer 28 may be softened by heating device package 10.

The above described process is used to expose integrated circuit 12 and substrate 14 for examination. Separating stiffener 26 and substrate 14 so as to gain access to integrated circuit 12 and substrate 14 often results in damage to substrate 14. For example, layer of solder mask material 24 and underlying conductive traces (e.g., conductive trace 16) formed upon the upper surface of substrate 14 are typically scratched or broken during the process, making subsequent electrical evaluation of substrate 14 difficult or impossible.

It would be beneficial to have an apparatus and method for separating a stiffener member from a substrate of a flip chip integrated circuit package such that the substrate is not damaged. Such an apparatus and method would facilitate subsequent substrate examination for evaluation of a fabrication process used to form the device, or for failure analysis.

SUMMARY OF THE INVENTION

The problems outlined above are in large part solved by an apparatus and method for separating a stiffener member from a substrate of a flip chip integrated circuit package such that the substrate is not damaged. The apparatus includes a base plate for receiving an upper portion of the device package including the stiffener, and a hand tool for receiving a lower portion of the device package including the substrate. During use, the base plate engages the upper portion of the device package and the hand tool engages the lower portion. The hand tool is moved in relation to the base plate such that an adhesive layer joining the stiffener and substrate is broken (i.e., sheared), and the stiffener is separated from the substrate.

In one embodiment, an upper surface of the base plate has an opening for receiving the upper portion of the device package. A vertical depth of the base plate opening, relative to an upper surface of the base plate, is substantially equal to a vertical height of the stiffener. As a result, when the device package is inverted and positioned within the opening of the base plate, the stiffener is substantially contained within the opening, and the substrate resides above the upper surface of the base plate.

The hand tool includes a base and a handle. In one embodiment, the base of the hand tool has two substantially rectangular and opposed surfaces. Two protrusions extend outwardly from opposite sides of one of the two opposed surfaces (i.e., a first surface). The protrusions are spaced to receive one of two pairs of parallel sides of the substrate, and define an opening in the first surface. The opening in the first surface of the base is dimensioned to receive the lower portion of the device package. The handle is substantially cylindrical, and is attached to the other of the two opposed surfaces (i.e., a second surface) of the base.

The present method for separating a stiffener from a device package substrate employs the apparatus described above. The device package is first positioned within the base plate such that the stiffener is contained within the base plate opening and the substrate resides above the upper surface of the base plate. The hand tool is then lowered over the substrate such that the substrate is contained within the opening in the first surface of the base of the hand tool (i.e., the hand tool opening). The hand tool is then moved in relation to the base plate such that the stiffener is separated from the substrate. This movement is accomplished by using the handle to rotate the hand tool in a side-to-side manner about an axis passing through the center of the device package. The relative motion between the stiffener and the substrate breaks the adhesive layer joining the stiffener and substrate, thus separating the stiffener and substrate.

As the adhesive layer joining the stiffener and substrate is typically an amorphous polymer material which softens with increased temperature, the base plate may be heated prior to effecting the movement of the hand tool in relation to the base plate. The base plate may be, for example, attached to an upper surface of a hot plate which is heated during operation of the hot plate.

BRIEF DESCRIPTION OF THE DRAWINGS

Other objects and advantages of the invention will become apparent upon reading the following detailed description and upon reference to the accompanying drawings in which.

Figure 1:
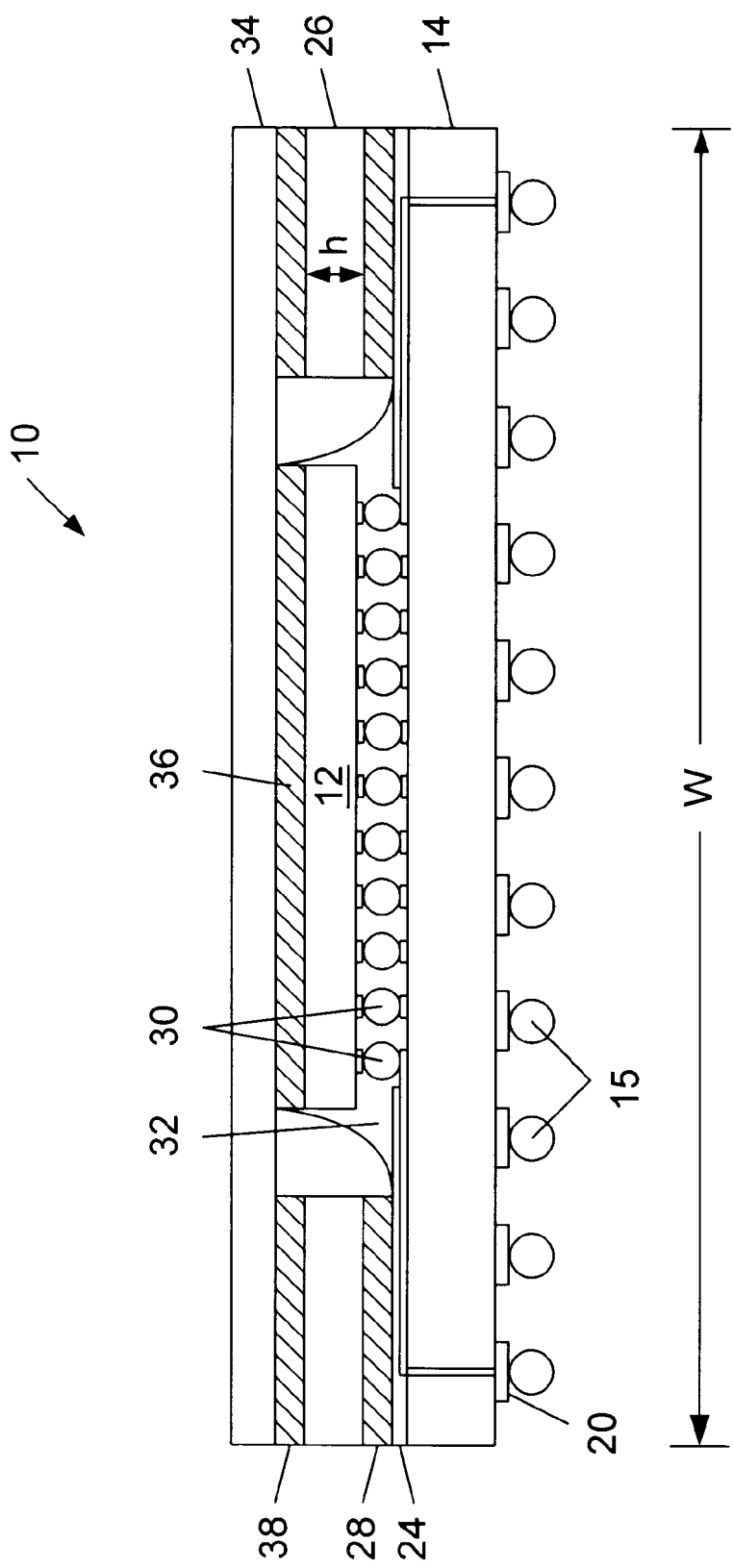
FIG. 1 is a cross-sectional view of one embodiment of a grid array device package in current use, wherein the device package includes a package substrate, a stiffener attached to the upper surface of the substrate, and a heat spreader attached to the upper surface of the stiffener.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
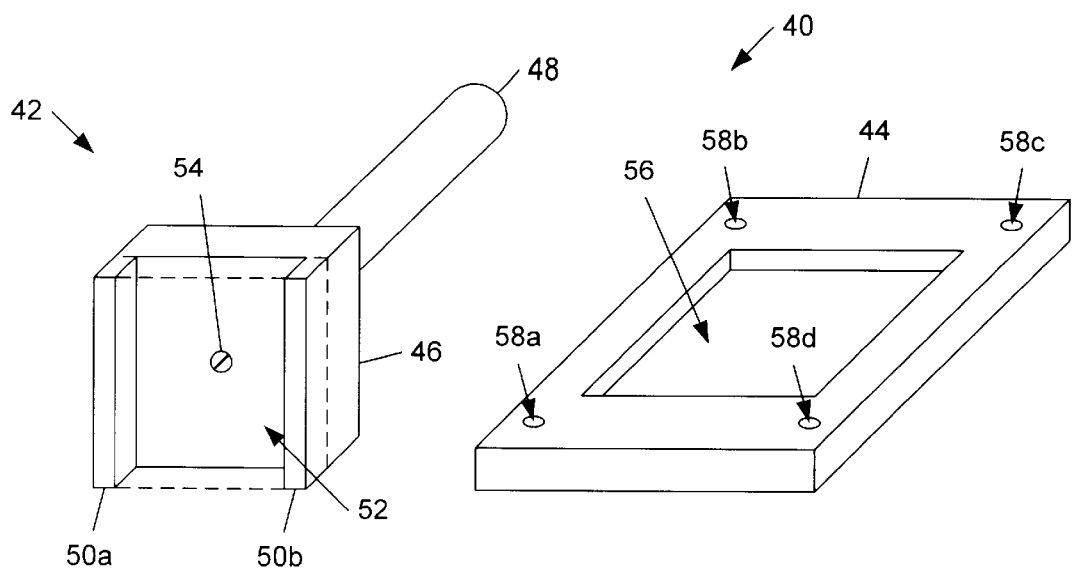
FIG. 2 is an isometric view of one embodiment of an apparatus for separating the stiffener from the substrate following removal of the heat spreader, wherein the apparatus includes a hand tool and a base plate.

FIG. 2 is an isometric view of one embodiment of an apparatus 40 for separating a stiffener from a device package substrate following removal of any heat spreader. Apparatus 40 includes a hand tool 42 and a base plate 44. Using as an example device package 10 of FIG. 1, apparatus 40 is used to separate stiffener 26 from substrate 14 after heat spreader 34 has been removed. In the embodiment shown, hand tool 42 includes a base 46 and a handle 48. Base 46 has two substantially rectangular and opposed surfaces. Two protrusions 50a and 50b, collectively referred to as protrusions 50, extend outwardly from a first of the two opposed surfaces (i.e., the first surface). Protrusions 50 define an opening 52 in the first surface. Opening 52 is dimensioned to receive a lower portion of device package 10 which includes substrate 14. A screw 54 extending through base 46 from the first surface to the second of the two opposed surfaces (i.e., the second surface) attaches a substantially cylindrical handle 48 to the second surface. Base plate 44 has an opening 56 in an upper surface. Opening 56 is dimensioned to receive an upper portion of device package 10 following removal of heat spreader 34. The upper portion of device package 10 includes stiffener 26. Base plate 44 also includes four holes 58a–d, extending through base plate 44 from the upper surface to an underside surface, for mounting base plate 44 to a fixed surface.

During use of apparatus 40, base plate 44 is mounted to a fixed surface and holds the upper portion of device package 10 in place. Hand tool 42 is used to engage the lower portion of device package 10. Hand tool 42 is then rotated about an axis passing through the center of device package 10. Such relative movement between hand tool 42 and base plate 44 creates a shear force within first adhesive layer 28 which breaks first adhesive layer 28, separating stiffener 26 from substrate 14. The separation process does not damage substrate 14, facilitating subsequent examination of substrate 14 for quality control or fault analysis purposes.

First adhesive layer 28 is typically an amorphous polymer material having a glass transition temperature ("Tg"). The adhesive material is in a "glassy" state at temperatures below Tg, and is hard and brittle. At temperatures above Tg, the adhesive material is in a "rubbery" state and is soft and flexible. As less force is required to break first adhesive layer 28 when first adhesive layer 28 is in the rubbery state, first adhesive layer 28 is preferably heated above the Tg of the adhesive material prior to effecting the relative movement between hand tool 42 and base plate 44.

Figures 3, 4:
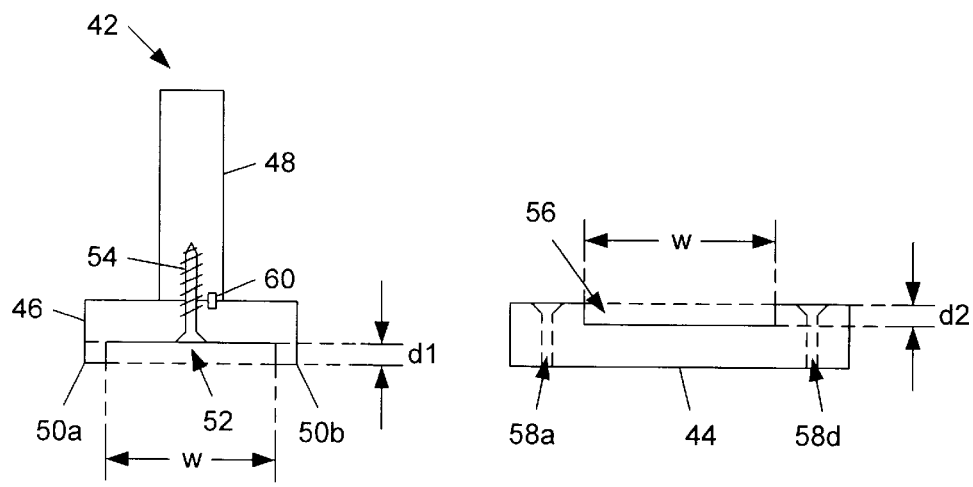
FIG. 3 is a cross-sectional view of the hand tool of FIG. 2.
FIG. 4 is a cross-sectional view of the base plate of FIG. 2.

FIG. 3 is a cross-sectional view of hand tool 42 of FIG. 2. Opening 52 of hand tool 42 has a width w substantially equal to a width w of device package 10 (FIG. 1). Protrusions 50 are thus spaced to receive opposite sides of the lower portion of device package 10 which includes substrate 14. Opening 52 has a depth d1 which is sufficient to accept substrate 14 with attached solder balls 15. (See FIG. 7). A pin 60 extending into both handle 48 and base 46 prevents handle 48 from rotating around screw 54 during use, thus keeping handle 48 firmly attached to base 46.

FIG. 4 is a cross-sectional view of base plate 44 of FIG. 2. Opening 56 of base plate 44 has a width w substantially equal to width w of device package 10 (FIG. 1), and a depth d2 which is substantially equal to a vertical height h of stiffener 26 (FIG. 1). Opening 56 is thus dimensioned to receive stiffener 26 residing in the upper portion of device package 10.

Figure 5:
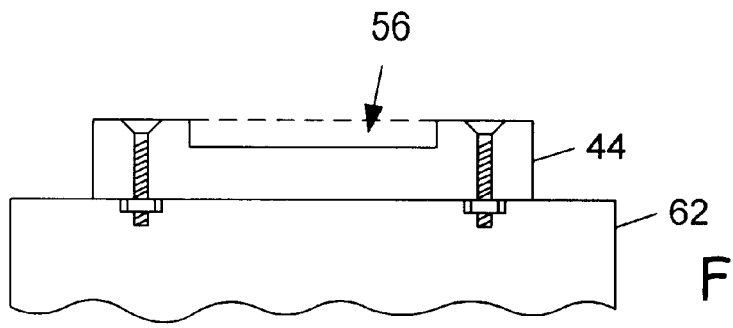
FIG. 5 is a cross-sectional view of the base plate of FIG. 2 attached to a fixed surface.

FIGS. 5–9 will now be used to describe a method for separating a stiffener from a device package substrate following removal of a heat spreader. The method employs apparatus 40 described above. Base plate 44 is first attached to a fixed surface 62. FIG. 5 is a cross-sectional view of base plate 44 attached to a fixed surface 62 such that opening 56 faces up. Fixed surface 62 may be, for example, the upper surface of a hot plate wherein fixed surface 62 is heated during operation of the hot plate.

Figure 6:
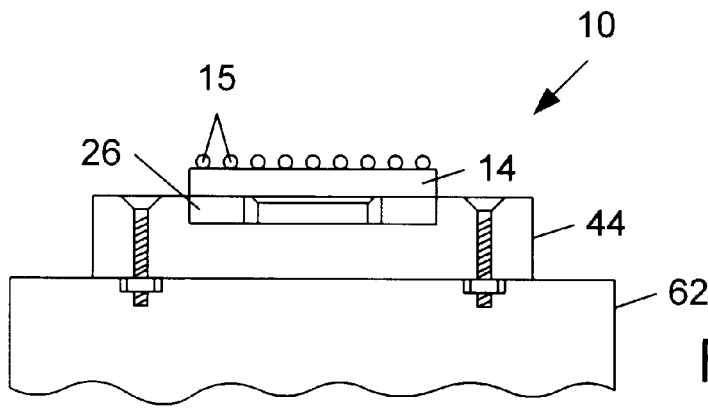
FIG. 6 is a cross-sectional view of the device package of FIG. 1 positioned within the base plate of FIG. 2 such that the stiffener is substantially contained within an opening in an upper surface of the base plate and the substrate resides above the upper surface of the base plate.

Device package 10 is then inverted, and the upper portion of device package 10 (including stiffener 26) is positioned within opening 56 of base plate 44. FIG. 6 is a cross-sectional view of such positioning of device package 10, wherein stiffener 26 is substantially contained within opening 56, and substrate 14 with attached solder balls 15 reside above the upper surface of base plate 44.

Figure 7:
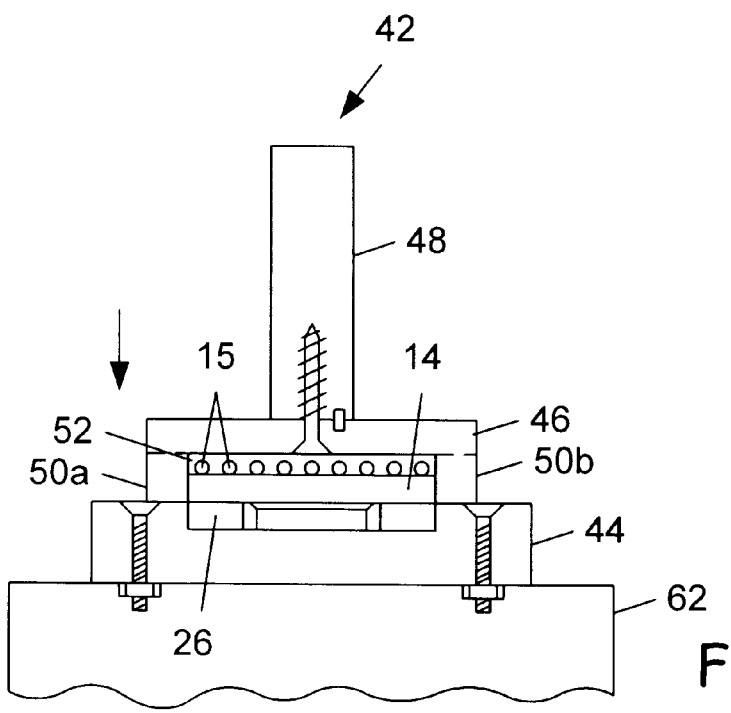
FIG. 7 is a cross-sectional view illustrating the lowering of the hand tool of FIG. 2 over the device package positioned within the base plate such that the substrate is contained within an opening of the hand tool.

Hand tool 42 is then used to engage the upper portion of device package 10. FIG. 7 is a cross-sectional view illustrating the lowering of hand tool 42 over device package 10 such that substrate 14 and attached solder balls 15 are contained within opening 52 of hand tool 42.

Figure 8:
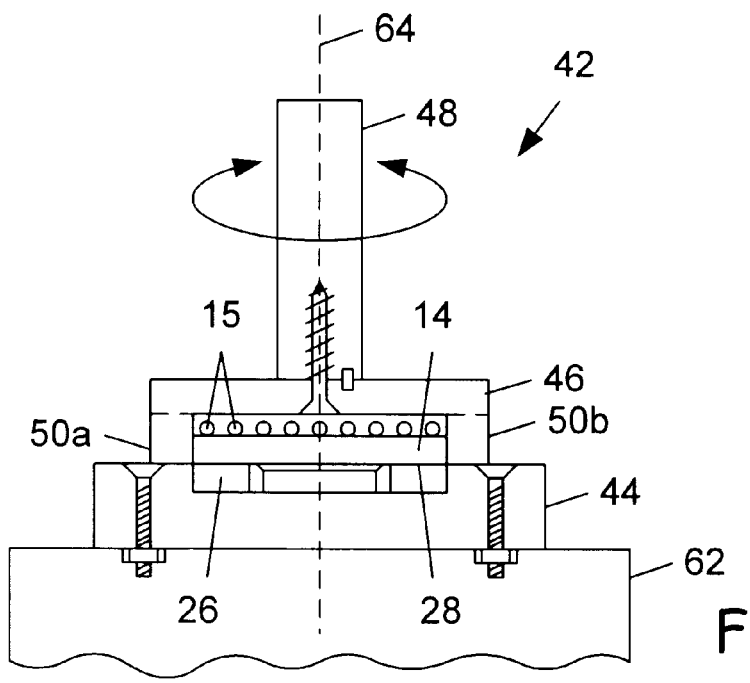
FIG. 8 is a cross-sectional view showing how a side-to-side rotation of the hand tool is effected about a vertical axis using a handle of the hand tool.

Using handle 48, hand tool 42 is then moved relative to base plate 44 such that stiffener 26 is separated from substrate 14. FIG. 8 is a cross-sectional view showing how a side-to-side rotation of hand tool 48 is effected about an axis 64 using handle 48. Axis 64 is normal to the upper surface of base plate 44 and passes through the center of device package 10. The side-to-side rotation of hand tool 48 moves substrate 14 in relation to stiffener 26, creating a shear force within first adhesive layer 28 which breaks first adhesive layer 28. Stiffener 26 is thus separated from substrate 14 by such relative motion.

Figure 9:
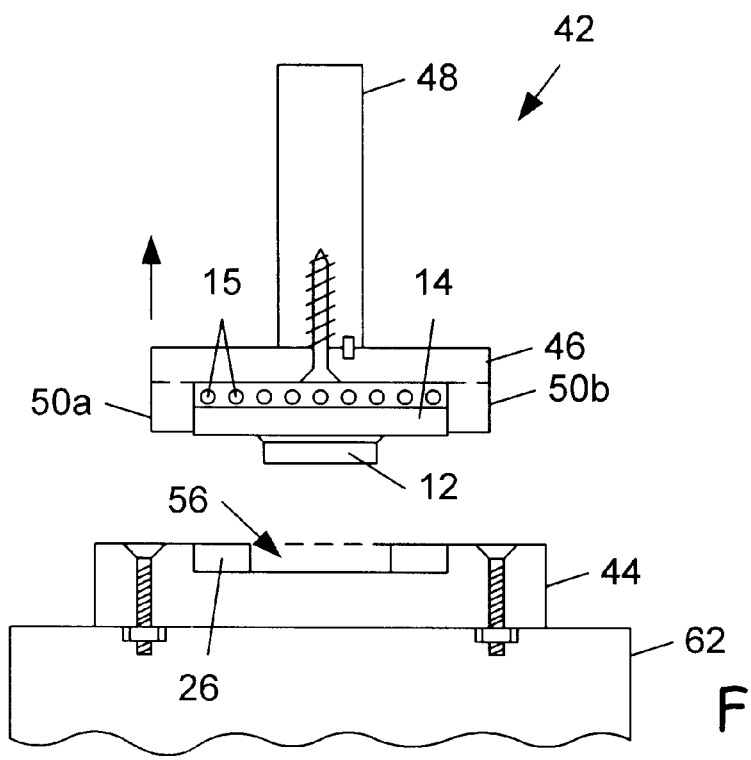
FIG. 9 is a cross-sectional view illustrating the substrate being lifted above the base plate along with the hand tool, while the stiffener remains within the opening of the base plate.

Following the breaking of first adhesive layer 28, hand tool 42 is separated from base plate 44 by lifting. Frictional forces between protrusions 50 and substrate 14 may be relied upon to keep substrate 14 and attached solder balls 15 and integrated circuit 12 within opening 52 of hand tool 42 as hand tool 42 is lifted above base plate 44. Stiffener 26 remains within opening 56 of base plate 44. FIG. 9 is a cross-sectional view illustrating substrate 14 and attached solder balls 15 and integrated circuit 12 being lifted above base plate 44 along with hand tool 42, while stiffener 26 remains within opening 56 of base plate 44. Thus stiffener 26 is separated from substrate 14 without damage to substrate 14.

Base plate 44 is preferably made of a thermally conductive material (e.g., a metal such as aluminum), and is preferably heated before hand tool 48 is moved relative to base plate 44. Such heating is preferably accomplished such that first adhesive layer 28 reaches the Tg of the adhesive material before hand tool 48 is rotated. Handle 48 is preferably made of a thermally insulating material (e.g., plastic or wood) such that heat energy is not conducted from ba se plate 44 to a user's hand during use.

The embodiment of apparatus 40 described above was built and tested. During the testing, the above described method was used. The separation process proved to be fast, simple to perform, and resulted in keeping substrates electrically intact in over 95 percent of test cases.

It will be appreciated to those skilled in the art having the benefit of this disclosure that this invention is believed to be an apparatus and method for separating a stiffener member from a substrate of a flip chip integrated circuit package such that the substrate is not damaged. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An apparatus for separating a stiffener from a device package substrate, comprising:
    a base plate adapted to receive a first portion of the device package including the stiffener; and
    a hand tool adapted to receive a second portion of the device package including the substrate;
    wherein during use the base plate engages the first portion and the hand tool engages the second portion, and wherein the hand tool is moved in relation to the base plate such that the stiffener is separated from the substrate.

2. The apparatus as recited in claim 1, wherein an upper surface of the base plate has an opening dimensioned to receive the first portion of the device package including the stiffener.

3. The apparatus as recited in claim 2, wherein a vertical depth of the opening relative to the upper surface is substantially equal to a vertical height of the stiffener.

4. The apparatus as recited in claim 2, wherein when the device package is positioned within the opening of the base plate, the stiffener is substantially contained within the opening, and the substrate resides above the upper surface of the base plate.

5. The apparatus as recited in claim 1, wherein the hand tool comprises:
    a base having a first and second opposed surfaces, wherein the first surface is adapted to receive the second portion of the device package including the substrate; and
    a handle attached to the second surface of the base.

6. The apparatus as recited in claim 5, wherein the substrate and the first surface of the base are substantially rectangular and have two pairs of parallel sides, and wherein protrusions extend outwardly from the first surface of the base along one of the two pairs of parallel sides, and wherein the protrusions are spaced to receive one of the two pairs of parallel sides of the substrate.

7. The apparatus as recited in claim 6, wherein the handle is substantially cylindrical and extends outwardly from the second surface of the base.

8. An apparatus for separating a stiffener from a device package substrate, comprising:
    a base plate having an opening dimensioned to receive a first portion of the device package including the stiffener; and
    a hand tool having an opening dimensioned to receive a second portion of the device package including the substrate;
    wherein during use the base plate engages the first portion of the device package and the hand tool engages the second portion, and wherein the hand tool is moved in relation to the base plate such that the stiffener is separated from the substrate.

9. The apparatus as recited in claim 8, wherein the hand tool includes a base, and wherein the substrate and a surface of the base are substantially rectangular and have two pairs of parallel sides, and wherein the opening of the hand tool is formed between two protrusions extending outwardly from the surface of the base along one of the two pairs of parallel sides, and wherein the protrusions are spaced to receive one of the two pairs of parallel sides of the substrate.

10. A method for separating a stiffener from a device package substrate, comprising:
    providing an apparatus comprising:
        a base plate having an opening in an upper surface, wherein the opening is dimensioned to receive a first portion of the device package including the stiffener; and
        a hand tool having an opening dimensioned to receive a second portion of the device package including the substrate;
    positioning the device package within the base plate such that the stiffener is contained within the base plate opening and the substrate resides above the upper surface;
    lowering the hand tool over the substrate such that the substrate is contained within the hand tool opening; and
    moving the hand tool in relation to the base plate such that the stiffener is separated from the substrate.

11. The method as recited in claim 10, further comprising heating the base plate to soften an adhesive layer joining the stiffener and substrate, wherein the heating is accomplished prior to the moving.

12. A method for separating a stiffener from a device package substrate, comprising:
    providing an apparatus comprising:
        a base plate having an opening in an upper surface, wherein the opening is dimensioned to receive a first portion of the device package including the stiffener; and
        a hand tool comprising:
            a base having an opening dimensioned to receive a second portion of the device package including the substrate; and
            a handle attached to the base and extending outwardly from the base;
    positioning the device package within the base plate such that the stiffener is contained within the base plate opening and the substrate resides above the upper surface;
    lowering the hand tool over the substrate such that the substrate is contained within the opening in the base of the hand tool; and
    using the handle to rotate the hand tool about an axis passing through the center of the device package such that the hand tool is moved in relation to the base plate and the stiffener is separated from the substrate.

13. The method as recited in claim 12, further comprising heating the base plate to soften an adhesive layer joining the stiffener and substrate, wherein the heating is accomplished prior to the using.

* * * * *